(12) United States Patent
Campbell et al.

(10) Patent No.: US 7,876,114 B2
(45) Date of Patent: Jan. 25, 2011

(54) DIFFERENTIAL WAVEGUIDE PROBE

(75) Inventors: Richard L. Campbell, Portland, OR (US); Michael Andrews, Hillsboro, OR (US)

(73) Assignee: Cascade Microtech, Inc., Beaverton, OR (US)

(*) Notice: Subject to any disclaimer, the term of this patent is extended or adjusted under 35 U.S.C. 154(b) by 175 days.

(21) Appl. No.: 12/221,828

(22) Filed: Aug. 7, 2008
(Under 37 CFR 1.47)

(65) Prior Publication Data

US 2009/0189623 A1    Jul. 30, 2009

Related U.S. Application Data

(60) Provisional application No. 60/964,103, filed on Aug. 8, 2007.

(51) Int. Cl.
*G01R 31/02* (2006.01)
*H01P 1/00* (2006.01)

(52) U.S. Cl. ........................... 324/754; 333/248

(58) Field of Classification Search ................... None
See application file for complete search history.

(56) References Cited

U.S. PATENT DOCUMENTS

| | | |
|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1952 | Dodd |
| 2,901,696 A | 8/1959 | Möllfors |
| 2,921,276 A | 1/1960 | Fubini |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |

(Continued)

FOREIGN PATENT DOCUMENTS

CH        607045       11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Jermele M Hollington
(74) *Attorney, Agent, or Firm*—Chernoff, Vilhauer, McClung & Stenzel

(57) ABSTRACT

A wafer probe comprises a contact conductively interconnected with the wall of a waveguide channel and supported by a substrate that projects from an end of a waveguide channel.

20 Claims, 5 Drawing Sheets

U.S. PATENT DOCUMENTS

| | | |
|---|---|---|
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |

| | | | | | |
|---|---|---|---|---|---|
| 4,744,041 A | 5/1988 | Strunk et al. | 5,030,907 A | 7/1991 | Yih et al. |
| 4,746,857 A | 5/1988 | Sakai et al. | 5,041,782 A | 8/1991 | Marzan |
| 4,749,942 A | 6/1988 | Sang et al. | 5,045,781 A | 9/1991 | Gleason et al. |
| 4,754,239 A | 6/1988 | Sedivec | 5,059,898 A | 10/1991 | Barsotti et al. |
| 4,755,742 A | 7/1988 | Agoston et al. | 5,061,192 A | 10/1991 | Chapin et al. |
| 4,755,746 A | 7/1988 | Mallory et al. | 5,061,823 A | 10/1991 | Carroll |
| 4,755,747 A | 7/1988 | Sato | 5,066,357 A | 11/1991 | Smyth, Jr. et al. |
| 4,755,872 A | 7/1988 | Bestler et al. | 5,069,628 A | 12/1991 | Crumly |
| 4,755,874 A | 7/1988 | Esrig et al. | 5,082,627 A | 1/1992 | Stanbro |
| 4,757,255 A | 7/1988 | Margozzi | 5,084,671 A | 1/1992 | Miyata et al. |
| 4,764,723 A | 8/1988 | Strid | 5,089,774 A | 2/1992 | Nakano |
| 4,766,384 A | 8/1988 | Kleinberg et al. | 5,091,692 A | 2/1992 | Ohno et al. |
| 4,772,846 A | 9/1988 | Reeds | 5,091,732 A | 2/1992 | Mileski et al. |
| 4,780,670 A | 10/1988 | Cherry | 5,095,891 A | 3/1992 | Reitter |
| 4,783,625 A | 11/1988 | Harry et al. | 5,097,101 A | 3/1992 | Trobough |
| 4,788,851 A | 12/1988 | Brault | 5,097,207 A | 3/1992 | Blanz |
| 4,791,363 A | 12/1988 | Logan | 5,101,453 A | 3/1992 | Rumbaugh |
| 4,793,814 A | 12/1988 | Zifcak et al. | 5,107,076 A | 4/1992 | Bullock et al. |
| 4,795,962 A | 1/1989 | Yanagawa et al. | 5,116,180 A | 5/1992 | Fung et al. |
| 4,805,627 A | 2/1989 | Klingenbeck et al. | 5,126,286 A | 6/1992 | Chance |
| 4,810,981 A | 3/1989 | Herstein | 5,126,696 A | 6/1992 | Grote et al. |
| 4,812,754 A | 3/1989 | Tracy et al. | 5,133,119 A | 7/1992 | Afshari et al. |
| 4,818,059 A | 4/1989 | Kakii et al. | 5,134,365 A | 7/1992 | Okubo et al. |
| 4,827,211 A | 5/1989 | Strid et al. | 5,136,237 A | 8/1992 | Smith et al. |
| 4,831,494 A | 5/1989 | Arnold et al. | 5,138,289 A | 8/1992 | McGrath |
| 4,835,495 A | 5/1989 | Simonutti | 5,142,224 A | 8/1992 | Smith et al. |
| 4,837,507 A | 6/1989 | Hechtman | 5,145,552 A | 9/1992 | Yoshizawa et al. |
| 4,839,587 A | 6/1989 | Flatley et al. | 5,148,131 A | 9/1992 | Amboss et al. |
| 4,849,689 A | 7/1989 | Gleason et al. | 5,159,264 A | 10/1992 | Anderson |
| 4,853,624 A | 8/1989 | Rabjohn | 5,159,267 A | 10/1992 | Anderson |
| 4,853,627 A | 8/1989 | Gleason et al. | 5,159,752 A | 11/1992 | Mahant-Shetti et al. |
| 4,858,160 A | 8/1989 | Strid et al. | 5,160,883 A | 11/1992 | Blanz |
| 4,859,989 A | 8/1989 | McPherson | 5,164,319 A | 11/1992 | Hafeman et al. |
| 4,864,227 A | 9/1989 | Sato | 5,166,606 A | 11/1992 | Blanz |
| 4,871,883 A | 10/1989 | Guiol | 5,172,049 A | 12/1992 | Kiyokawa et al. |
| 4,871,964 A | 10/1989 | Boll et al. | 5,172,050 A | 12/1992 | Swapp |
| 4,888,550 A | 12/1989 | Reid | 5,172,051 A | 12/1992 | Zamborelli |
| 4,891,584 A | 1/1990 | Kamieniecki et al. | 5,177,438 A | 1/1993 | Littlebury et al. |
| 4,893,914 A | 1/1990 | Hancock et al. | 5,180,977 A | 1/1993 | Huff |
| 4,894,612 A | 1/1990 | Drake et al. | 5,187,443 A | 2/1993 | Bereskin |
| 4,899,126 A | 2/1990 | Yamada | 5,198,752 A | 3/1993 | Miyata et al. |
| 4,899,998 A | 2/1990 | Feramachi | 5,198,753 A | 3/1993 | Hamburgen |
| 4,901,012 A | 2/1990 | Gloanec et al. | 5,202,558 A | 4/1993 | Barker |
| 4,904,933 A | 2/1990 | Snyder et al. | 5,202,648 A | 4/1993 | McCandless |
| 4,904,935 A | 2/1990 | Calma et al. | 5,207,585 A | 5/1993 | Byrnes et al. |
| 4,906,920 A | 3/1990 | Huff et al. | 5,214,243 A | 5/1993 | Johnson |
| 4,908,570 A | 3/1990 | Gupta et al. | 5,214,374 A | 5/1993 | St. Onge |
| 4,912,399 A | 3/1990 | Greub et al. | 5,225,037 A | 7/1993 | Elder et al. |
| 4,916,002 A | 4/1990 | Carver | 5,227,730 A | 7/1993 | King et al. |
| 4,916,398 A | 4/1990 | Rath | 5,232,789 A | 8/1993 | Platz et al. |
| 4,918,373 A | 4/1990 | Newberg | 5,233,197 A | 8/1993 | Bowman et al. |
| 4,918,383 A | 4/1990 | Huff et al. | 5,233,306 A | 8/1993 | Misra |
| 4,922,128 A | 5/1990 | Dhong et al. | 5,245,292 A | 9/1993 | Milesky et al. |
| 4,922,186 A | 5/1990 | Tsuchiya et al. | 5,266,889 A | 11/1993 | Harwood et al. |
| 4,922,912 A | 5/1990 | Watanabe | 5,266,963 A | 11/1993 | Carter |
| 4,926,172 A | 5/1990 | Gorsek | 5,267,088 A | 11/1993 | Nomura |
| 4,929,893 A | 5/1990 | Sato et al. | 5,270,664 A | 12/1993 | McMurtry et al. |
| 4,970,386 A | 11/1990 | Buck | 5,274,336 A | 12/1993 | Crook et al. |
| 4,972,073 A | 11/1990 | Lessing | 5,280,156 A | 1/1994 | Niori et al. |
| 4,975,638 A | 12/1990 | Evans et al. | 5,289,117 A | 2/1994 | Van Loan et al. |
| 4,980,637 A | 12/1990 | Huff et al. | 5,293,175 A | 3/1994 | Hemmie et al. |
| 4,980,638 A | 12/1990 | Dermon et al. | 5,298,972 A | 3/1994 | Heffner |
| 4,983,910 A | 1/1991 | Majidi-Ahy et al. | 5,304,924 A | 4/1994 | Yamano et al. |
| 4,987,100 A | 1/1991 | McBride et al. | 5,313,157 A | 5/1994 | Pasiecznik, Jr. |
| 4,988,062 A | 1/1991 | London | 5,315,237 A | 5/1994 | Iwakura et al. |
| 4,991,290 A | 2/1991 | MacKay | 5,316,435 A | 5/1994 | Monzingo |
| 4,998,062 A | 3/1991 | Ikeda | 5,317,656 A | 5/1994 | Moslehi et al. |
| 4,998,063 A | 3/1991 | Miller | 5,321,352 A | 6/1994 | Takebuchi |
| 5,001,423 A | 3/1991 | Abrami et al. | 5,321,453 A | 6/1994 | Mori et al. |
| 5,003,253 A | 3/1991 | Majidi-Ahy et al. | 5,326,412 A | 7/1994 | Schreiber et al. |
| 5,012,186 A | 4/1991 | Gleason | 5,334,931 A | 8/1994 | Clarke et al. |
| 5,020,219 A | 6/1991 | Leedy | 5,347,204 A | 9/1994 | Gregory et al. |
| 5,021,186 A | 6/1991 | Ota et al. | 5,355,079 A | 10/1994 | Evans et al. |

| | | | | | |
|---|---|---|---|---|---|
| 5,357,211 A | 10/1994 | Bryson et al. | 5,600,256 A | 2/1997 | Woith et al. |
| 5,360,312 A | 11/1994 | Mozingo | 5,601,740 A | 2/1997 | Eldridge et al. |
| 5,361,049 A | 11/1994 | Rubin et al. | 5,610,529 A | 3/1997 | Schwindt |
| 5,363,050 A | 11/1994 | Guo et al. | 5,611,008 A | 3/1997 | Yap |
| 5,367,165 A | 11/1994 | Toda et al. | 5,617,035 A | 4/1997 | Swapp |
| 5,369,368 A | 11/1994 | Kassen et al. | 5,621,333 A | 4/1997 | Long et al. |
| 5,371,654 A | 12/1994 | Beaman et al. | 5,621,400 A | 4/1997 | Corbi |
| 5,373,231 A | 12/1994 | Boll et al. | 5,623,213 A | 4/1997 | Liu et al. |
| 5,374,938 A | 12/1994 | Hatazawa et al. | 5,623,214 A | 4/1997 | Pasiecznik, Jr. |
| 5,376,790 A | 12/1994 | Linker et al. | 5,627,473 A | 5/1997 | Takami |
| 5,383,787 A | 1/1995 | Switky et al. | 5,628,057 A | 5/1997 | Phillips et al. |
| 5,389,885 A | 2/1995 | Swart | 5,629,838 A | 5/1997 | Knight et al. |
| 5,395,253 A | 3/1995 | Crumly | 5,631,571 A | 5/1997 | Spaziani et al. |
| 5,397,855 A | 3/1995 | Ferlier | 5,633,780 A | 5/1997 | Cronin |
| 5,404,111 A | 4/1995 | Mori et al. | 5,635,846 A | 6/1997 | Beaman et al. |
| 5,408,188 A | 4/1995 | Katoh | 5,642,298 A | 6/1997 | Mallory et al. |
| 5,408,189 A | 4/1995 | Swart et al. | 5,644,248 A | 7/1997 | Fujimoto |
| 5,412,330 A | 5/1995 | Ravel et al. | 5,653,939 A | 8/1997 | Hollis et al. |
| 5,412,866 A | 5/1995 | Woith et al. | 5,656,942 A | 8/1997 | Watts et al. |
| 5,414,565 A | 5/1995 | Sullivan et al. | 5,659,421 A | 8/1997 | Rahmel et al. |
| 5,422,574 A | 6/1995 | Kister | 5,666,063 A | 9/1997 | Abercrombie et al. |
| 5,430,813 A | 7/1995 | Anderson et al. | 5,669,316 A | 9/1997 | Faz et al. |
| 5,441,690 A | 8/1995 | Ayala-Esquilin et al. | 5,670,322 A | 9/1997 | Eggers et al. |
| 5,451,884 A | 9/1995 | Sauerland | 5,670,888 A | 9/1997 | Cheng |
| 5,453,404 A | 9/1995 | Leedy | 5,672,816 A | 9/1997 | Park et al. |
| 5,457,398 A | 10/1995 | Schwindt et al. | 5,675,499 A | 10/1997 | Lee et al. |
| 5,463,324 A | 10/1995 | Wardwell et al. | 5,675,932 A | 10/1997 | Mauney |
| 5,467,024 A | 11/1995 | Swapp | 5,676,360 A | 10/1997 | Boucher et al. |
| 5,469,324 A | 11/1995 | Henderson et al. | 5,678,210 A | 10/1997 | Hannah |
| 5,475,316 A | 12/1995 | Hurley et al. | 5,685,232 A | 11/1997 | Inoue |
| 5,476,211 A | 12/1995 | Khandros | 5,686,317 A | 11/1997 | Akram et al. |
| 5,477,011 A | 12/1995 | Singles et al. | 5,686,960 A | 11/1997 | Sussman et al. |
| 5,478,748 A | 12/1995 | Akins, Jr. et al. | 5,688,618 A | 11/1997 | Hulderman et al. |
| 5,479,108 A | 12/1995 | Cheng | 5,700,844 A | 12/1997 | Hederick et al. |
| 5,479,109 A | 12/1995 | Lau et al. | 5,704,355 A | 1/1998 | Bridges |
| 5,481,196 A | 1/1996 | Nosov | 5,715,819 A | 2/1998 | Svenson et al. |
| 5,481,936 A | 1/1996 | Yanagisawa | 5,720,098 A | 2/1998 | Kister |
| 5,487,999 A | 1/1996 | Farnworth | 5,723,347 A | 3/1998 | Kirano et al. |
| 5,488,954 A | 2/1996 | Sleva et al. | 5,726,211 A | 3/1998 | Hedrick et al. |
| 5,493,070 A | 2/1996 | Habu | 5,728,091 A | 3/1998 | Payne et al. |
| 5,493,236 A | 2/1996 | Ishii et al. | 5,729,150 A | 3/1998 | Schwindt |
| 5,500,606 A | 3/1996 | Holmes | 5,731,920 A | 3/1998 | Katsuragawa |
| 5,505,150 A | 4/1996 | James et al. | 5,742,174 A | 4/1998 | Kister et al. |
| 5,506,498 A | 4/1996 | Anderson et al. | 5,744,971 A | 4/1998 | Chan et al. |
| 5,506,515 A | 4/1996 | Godshalk et al. | 5,748,506 A | 5/1998 | Bockelman |
| 5,507,652 A | 4/1996 | Wardwell | 5,751,153 A | 5/1998 | Bockelman |
| 5,510,792 A | 4/1996 | Ono et al. | 5,751,252 A | 5/1998 | Phillips |
| 5,511,010 A | 4/1996 | Burns | 5,756,021 A | 5/1998 | Bedrick et al. |
| 5,512,835 A | 4/1996 | Rivera et al. | 5,756,908 A | 5/1998 | Knollmeyer et al. |
| 5,517,126 A | 5/1996 | Yamaguchi | 5,764,070 A | 6/1998 | Pedder |
| 5,521,518 A | 5/1996 | Higgins | 5,767,690 A | 6/1998 | Fujimoto |
| 5,521,522 A | 5/1996 | Abe et al. | 5,772,451 A | 6/1998 | Dozier, II et al. |
| 5,523,694 A | 6/1996 | Cole, Jr. | 5,773,780 A | 6/1998 | Eldridge et al. |
| 5,527,372 A | 6/1996 | Voisine et al. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A | 8/1998 | Bockelman et al. |
| 5,532,608 A | 7/1996 | Behfar-Rad et al. | 5,794,133 A | 8/1998 | Kashima |
| 5,537,372 A | 7/1996 | Albrecht et al. | 5,803,607 A | 9/1998 | Jones et al. |
| 5,539,323 A | 7/1996 | Davis, Jr. | 5,804,607 A | 9/1998 | Hedrick et al. |
| 5,539,676 A | 7/1996 | Yamaguchi | 5,804,982 A | 9/1998 | Lo et al. |
| 5,550,481 A | 8/1996 | Holmes et al. | 5,804,983 A | 9/1998 | Nakajima et al. |
| 5,561,378 A | 10/1996 | Bockelman et al. | 5,806,181 A | 9/1998 | Khandros et al. |
| 5,565,788 A | 10/1996 | Burr et al. | 5,807,107 A | 9/1998 | Bright et al. |
| 5,565,881 A | 10/1996 | Phillips et al. | 5,810,607 A | 9/1998 | Shih et al. |
| 5,569,591 A | 10/1996 | Kell et al. | 5,811,751 A | 9/1998 | Leona et al. |
| 5,571,324 A | 11/1996 | Sago et al. | 5,811,982 A | 9/1998 | Beaman et al. |
| 5,578,932 A | 11/1996 | Adamian | 5,813,847 A | 9/1998 | Eroglu et al. |
| 5,583,445 A | 12/1996 | Mullen | 5,814,847 A | 9/1998 | Shihadeh et al. |
| 5,584,120 A | 12/1996 | Roberts | 5,820,014 A | 10/1998 | Dozier, II et al. |
| 5,584,608 A | 12/1996 | Gillespie | 5,821,763 A | 10/1998 | Beaman et al. |
| 5,589,781 A | 12/1996 | Higgins et al. | 5,824,494 A | 10/1998 | Feldberg |
| 5,594,358 A | 1/1997 | Ishikawa et al. | 5,829,128 A | 11/1998 | Eldridge et al. |

| | | | | | | |
|---|---|---|---|---|---|---|
| 5,829,437 | A | 11/1998 | Bridges | 6,032,714 A | 3/2000 | Fenton |
| 5,831,442 | A | 11/1998 | Heigl | 6,033,935 A | 3/2000 | Dozier, II et al. |
| 5,832,601 | A | 11/1998 | Eldridge et al. | 6,034,533 A | 3/2000 | Tervo et al. |
| 5,833,601 | A | 11/1998 | Swartz et al. | 6,037,785 A | 3/2000 | Higgins |
| 5,838,160 | A | 11/1998 | Beaman et al. | 6,040,739 A | 3/2000 | Wedeen et al. |
| 5,841,288 | A | 11/1998 | Meaney et al. | 6,042,712 A | 3/2000 | Mathieu |
| 5,841,342 | A | 11/1998 | Hegmann et al. | 6,043,563 A | 3/2000 | Eldridge et al. |
| 5,846,708 | A | 12/1998 | Hollis et al. | 6,046,599 A | 4/2000 | Long et al. |
| 5,847,569 | A | 12/1998 | Ho et al. | 6,049,216 A | 4/2000 | Yang et al. |
| 5,848,500 | A | 12/1998 | Kirk | 6,049,976 A | 4/2000 | Khandros |
| 5,852,232 | A | 12/1998 | Samsavar et al. | 6,050,829 A | 4/2000 | Eldridge et al. |
| 5,852,871 | A | 12/1998 | Khandros | 6,051,422 A | 4/2000 | Kovacs et al. |
| 5,854,608 | A | 12/1998 | Leisten | 6,052,653 A | 4/2000 | Mazur et al. |
| 5,864,946 | A | 2/1999 | Eldridge et al. | 6,054,651 A | 4/2000 | Fogel et al. |
| 5,867,073 | A | 2/1999 | Weinreb et al. | 6,054,869 A | 4/2000 | Hutton et al. |
| 5,869,326 | A | 2/1999 | Hofmann | 6,059,982 A | 5/2000 | Palagonia et al. |
| 5,869,974 | A | 2/1999 | Akram et al. | 6,060,888 A | 5/2000 | Blackham et al. |
| 5,874,361 | A | 2/1999 | Collins et al. | 6,060,892 A | 5/2000 | Yamagata |
| 5,876,082 | A | 3/1999 | Kempf et al. | 6,061,589 A | 5/2000 | Bridges et al. |
| 5,878,486 | A | 3/1999 | Eldridge et al. | 6,062,879 A | 5/2000 | Beaman et al. |
| 5,879,289 | A | 3/1999 | Yarush et al. | 6,064,213 A | 5/2000 | Khandros et al. |
| 5,883,522 | A | 3/1999 | O'Boyle | 6,064,217 A | 5/2000 | Smith |
| 5,883,523 | A | 3/1999 | Ferland et al. | 6,064,218 A | 5/2000 | Godfrey et al. |
| 5,884,398 | A | 3/1999 | Eldridge et al. | 6,066,911 A | 5/2000 | Lindemann et al. |
| 5,888,075 | A | 3/1999 | Hasegawa et al. | 6,071,009 A | 6/2000 | Clyne |
| 5,892,539 | A | 4/1999 | Colvin | 6,078,183 A | 6/2000 | Cole, Jr. |
| 5,896,038 | A | 4/1999 | Budnaitis et al. | 6,078,500 A | 6/2000 | Beaman et al. |
| 5,900,737 | A | 5/1999 | Graham et al. | 6,090,261 A | 7/2000 | Mathieu |
| 5,900,738 | A | 5/1999 | Khandros et al. | 6,091,236 A | 7/2000 | Piety et al. |
| 5,903,143 | A | 5/1999 | Mochizuki et al. | 6,091,255 A | 7/2000 | Godfrey |
| 5,905,421 | A | 5/1999 | Oldfield | 6,091,256 A | 7/2000 | Long et al. |
| 5,910,727 | A | 6/1999 | Fujihara et al. | 6,096,567 A | 8/2000 | Kaplan et al. |
| 5,912,046 | A | 6/1999 | Eldridge et al. | 6,100,815 A | 8/2000 | Pailthorp |
| 5,914,613 | A | 6/1999 | Gleason et al. | 6,104,201 A | 8/2000 | Beaman et al. |
| 5,914,614 | A | 6/1999 | Beaman et al. | 6,104,206 A | 8/2000 | Verkuil |
| 5,916,689 | A | 6/1999 | Collins et al. | 6,110,823 A | 8/2000 | Eldridge et al. |
| 5,917,707 | A | 6/1999 | Khandros et al. | 6,114,864 A | 9/2000 | Soejima et al. |
| 5,923,180 | A | 7/1999 | Botka et al. | 6,114,865 A | 9/2000 | Lagowski et al. |
| 5,926,029 | A | 7/1999 | Ference et al. | 6,118,287 A | 9/2000 | Boll et al. |
| 5,926,951 | A | 7/1999 | Khandros et al. | 6,118,894 A | 9/2000 | Schwartz et al. |
| 5,940,965 | A | 8/1999 | Uhling et al. | 6,121,836 A | 9/2000 | Vallencourt |
| 5,944,093 | A | 8/1999 | Viswanath | 6,124,725 A | 9/2000 | Sato |
| 5,945,836 | A | 8/1999 | Sayre et al. | 6,127,831 A | 10/2000 | Khoury et al. |
| 5,949,383 | A | 9/1999 | Hayes et al. | 6,130,536 A | 10/2000 | Powell et al. |
| 5,949,579 | A | 9/1999 | Baker | 6,137,302 A | 10/2000 | Schwindt |
| 5,959,461 | A | 9/1999 | Brown et al. | 6,144,212 A | 11/2000 | Mizuta |
| 5,963,364 | A | 10/1999 | Leong et al. | 6,146,908 A | 11/2000 | Falque et al. |
| 5,966,645 | A | 10/1999 | Davis | 6,147,502 A | 11/2000 | Fryer et al. |
| 5,970,429 | A | 10/1999 | Martin | 6,147,851 A | 11/2000 | Anderson |
| 5,973,504 | A | 10/1999 | Chong | 6,150,186 A | 11/2000 | Chen et al. |
| 5,974,662 | A | 11/1999 | Eldridge et al. | 6,160,407 A | 12/2000 | Nikawa |
| 5,977,783 | A | 11/1999 | Takayama et al. | 6,166,553 A | 12/2000 | Sinsheimer |
| 5,981,268 | A | 11/1999 | Kovacs et al. | 6,168,974 B1 | 1/2001 | Chang et al. |
| 5,982,166 | A | 11/1999 | Mautz | 6,169,410 B1 | 1/2001 | Grace et al. |
| 5,983,493 | A | 11/1999 | Eldridge et al. | 6,172,337 B1 | 1/2001 | Johnsgard et al. |
| 5,993,611 | A | 11/1999 | Moroney, III et al. | 6,174,744 B1 | 1/2001 | Watanabe et al. |
| 5,994,152 | A | 11/1999 | Khandros et al. | 6,175,228 B1 | 1/2001 | Zamborelli et al. |
| 5,995,914 | A | 11/1999 | Cabot | 6,176,091 B1 | 1/2001 | Kishi et al. |
| 5,996,102 | A | 11/1999 | Haulin | 6,181,144 B1 | 1/2001 | Hembree et al. |
| 5,998,228 | A | 12/1999 | Eldridge et al. | 6,181,149 B1 | 1/2001 | Godfrey et al. |
| 5,998,768 | A | 12/1999 | Hunter et al. | 6,181,297 B1 | 1/2001 | Leisten |
| 5,998,864 | A | 12/1999 | Khandros et al. | 6,181,416 B1 | 1/2001 | Falk |
| 5,999,268 | A | 12/1999 | Yonezawa et al. | 6,184,053 B1 | 2/2001 | Eldridge et al. |
| 6,001,760 | A | 12/1999 | Katsuda et al. | 6,184,587 B1 | 2/2001 | Khandros et al. |
| 6,002,426 | A | 12/1999 | Back et al. | 6,184,845 B1 | 2/2001 | Leisten et al. |
| 6,006,002 | A | 12/1999 | Motok et al. | 6,191,596 B1 | 2/2001 | Abiko |
| 6,013,586 | A | 1/2000 | McGhee et al. | 6,194,720 B1 | 2/2001 | Li et al. |
| 6,019,612 | A | 2/2000 | Hasegawa et al. | 6,206,273 B1 | 3/2001 | Beaman et al. |
| 6,023,103 | A | 2/2000 | Chang et al. | 6,208,225 B1 | 3/2001 | Miller |
| 6,028,435 | A | 2/2000 | Nikawa | RE37,130 E | 4/2001 | Fiori, Jr. |
| 6,029,344 | A | 2/2000 | Khandros et al. | 6,211,663 B1 | 4/2001 | Moulthrop et al. |
| 6,031,383 | A | 2/2000 | Streib et al. | 6,211,837 B1 | 4/2001 | Crouch et al. |
| 6,032,356 | A | 3/2000 | Eldridge et al. | 6,215,196 B1 | 4/2001 | Eldridge et al. |

| Patent | Date | Inventor |
|---|---|---|
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |

| | | |
|---|---|---|
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Grube et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,582 B2 | 12/2004 | Morris et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,359 B1 | 3/2005 | Sekel |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,151 B2 * | 5/2005 | Shimada et al. ............ 250/234 |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |

| | | | |
|---|---|---|---|
| 6,924,655 B2 | 8/2005 | Kirby | |
| 6,927,078 B2 | 8/2005 | Saijo et al. | |
| 6,927,079 B1 | 8/2005 | Fyfield | |
| 6,927,586 B2 | 8/2005 | Thiessen | |
| 6,927,587 B2 | 8/2005 | Yoshioka | |
| 6,927,598 B2 | 8/2005 | Lee et al. | |
| 6,930,498 B2 | 8/2005 | Tervo et al. | |
| 6,933,713 B2 | 8/2005 | Cannon | |
| 6,933,717 B1 | 8/2005 | Dogaru et al. | |
| 6,933,725 B2 | 8/2005 | Lim et al. | |
| 6,933,736 B2 | 8/2005 | Kobayashi et al. | |
| 6,933,737 B2 | 8/2005 | Sugawara | |
| 6,937,020 B2 | 8/2005 | Munson et al. | |
| 6,937,037 B2 | 8/2005 | Eldridge et al. | |
| 6,937,040 B2 | 8/2005 | Maeda et al. | |
| 6,937,042 B2 | 8/2005 | Yoshida et al. | |
| 6,937,045 B2 | 8/2005 | Sinclair | |
| 6,937,341 B1 | 8/2005 | Woollam et al. | |
| 6,940,264 B2 | 9/2005 | Ryken, Jr. et al. | |
| 6,940,283 B2 | 9/2005 | McQueeney | |
| 6,943,563 B2 | 9/2005 | Martens | |
| 6,943,571 B2 | 9/2005 | Worledge | |
| 6,943,574 B2 | 9/2005 | Altmann et al. | |
| 6,944,380 B1 | 9/2005 | Hideo et al. | |
| 6,946,859 B2 | 9/2005 | Karavakis et al. | |
| 6,946,860 B2 | 9/2005 | Cheng et al. | |
| 6,946,864 B2 | 9/2005 | Gramann et al. | |
| 6,948,391 B2 | 9/2005 | Brassell et al. | |
| 6,948,981 B2 | 9/2005 | Pade | |
| 6,949,942 B2 | 9/2005 | Eldridge et al. | |
| 6,970,001 B2 | 11/2005 | Chheda et al. | |
| 6,987,483 B2 | 1/2006 | Tran | |
| 7,001,785 B1 | 2/2006 | Chen | |
| 7,002,133 B2 | 2/2006 | Beausoleil et al. | |
| 7,002,363 B2 | 2/2006 | Mathieu | |
| 7,002,364 B2 | 2/2006 | Kang et al. | |
| 7,003,184 B2 | 2/2006 | Ronnekleiv et al. | |
| 7,005,842 B2 | 2/2006 | Fink et al. | |
| 7,005,868 B2 | 2/2006 | McTigue | |
| 7,005,879 B1 | 2/2006 | Robertazzi | |
| 7,006,046 B2 | 2/2006 | Aisenbrey | |
| 7,007,380 B2 | 3/2006 | Das et al. | |
| 7,009,188 B2 | 3/2006 | Wang | |
| 7,009,383 B2 | 3/2006 | Harwood et al. | |
| 7,009,415 B2 | 3/2006 | Kobayashi et al. | |
| 7,011,531 B2 | 3/2006 | Egitto et al. | |
| 7,012,425 B2 | 3/2006 | Shoji | |
| 7,012,441 B2 | 3/2006 | Chou et al. | |
| 7,013,221 B1 | 3/2006 | Friend et al. | |
| 7,014,499 B2 | 3/2006 | Yoon | |
| 7,015,455 B2 | 3/2006 | Mitsuoka et al. | |
| 7,015,689 B2 | 3/2006 | Kasajima et al. | |
| 7,015,690 B2 | 3/2006 | Wang et al. | |
| 7,015,703 B2 | 3/2006 | Hopkins et al. | |
| 7,015,707 B2 | 3/2006 | Cherian | |
| 7,015,708 B2 | 3/2006 | Beckous et al. | |
| 7,015,709 B2 | 3/2006 | Capps et al. | |
| 7,015,710 B2 | 3/2006 | Yoshida et al. | |
| 7,015,711 B2 | 3/2006 | Rothaug et al. | |
| 7,019,541 B2 | 3/2006 | Kittrell | |
| 7,019,544 B1 | 3/2006 | Jacobs et al. | |
| 7,019,701 B2 | 3/2006 | Ohno et al. | |
| 7,020,360 B2 | 3/2006 | Satomura et al. | |
| 7,020,363 B2 | 3/2006 | Johannessen | |
| 7,022,976 B1 | 4/2006 | Santana, Jr. et al. | |
| 7,022,985 B2 | 4/2006 | Knebel et al. | |
| 7,023,225 B2 | 4/2006 | Blackwood | |
| 7,023,226 B2 | 4/2006 | Okumura et al. | |
| 7,023,231 B2 | 4/2006 | Howland, Jr. et al. | |
| 7,025,628 B2 | 4/2006 | LaMeres et al. | |
| 7,026,832 B2 | 4/2006 | Chaya et al. | |
| 7,026,833 B2 | 4/2006 | Rincon et al. | |
| 7,026,834 B2 | 4/2006 | Hwang | |
| 7,026,835 B2 | 4/2006 | Farnworth et al. | |
| 7,030,599 B2 | 4/2006 | Douglas | |
| 7,030,827 B2 | 4/2006 | Mahler et al. | |
| 7,032,307 B2 | 4/2006 | Matsunaga et al. | |
| 7,034,553 B2 | 4/2006 | Gilboe | |
| 7,035,738 B2 | 4/2006 | Matsumoto et al. | |
| 7,057,404 B2 | 6/2006 | Gleason et al. | |
| 7,071,722 B2 | 7/2006 | Yamada et al. | |
| 7,088,981 B2 | 8/2006 | Chang | |
| 7,096,133 B1 | 8/2006 | Martin et al. | |
| 7,161,363 B2 | 1/2007 | Gleason et al. | |
| 7,173,433 B2 | 2/2007 | Hoshi et al. | |
| 7,187,188 B2 | 3/2007 | Andrews et al. | |
| 7,188,037 B2 | 3/2007 | Hidehira | |
| 7,219,416 B2 | 5/2007 | Inoue et al. | |
| 7,233,160 B2 | 6/2007 | Hayden et al. | |
| 7,271,603 B2 | 9/2007 | Gleason et al. | |
| 7,276,922 B2 | 10/2007 | Miller et al. | |
| 7,315,175 B2 | 1/2008 | Cole | |
| 7,319,335 B2 | 1/2008 | Brunner et al. | |
| 7,319,337 B2 | 1/2008 | Sakata | |
| 7,323,680 B2 | 1/2008 | Chong | |
| 7,323,899 B2 | 1/2008 | Schuette et al. | |
| 7,327,153 B2 | 2/2008 | Weinraub | |
| 7,332,918 B2 | 2/2008 | Sugiyama et al. | |
| 7,332,923 B2 | 2/2008 | Schott et al. | |
| 7,342,402 B2 | 3/2008 | Kim et al. | |
| 7,403,028 B2 | 7/2008 | Campbell | |
| 2001/0002794 A1 | 6/2001 | Draving et al. | |
| 2001/0009061 A1 | 7/2001 | Gleason et al. | |
| 2001/0009377 A1 | 7/2001 | Schwindt et al. | |
| 2001/0010468 A1 | 8/2001 | Gleason et al. | |
| 2001/0020283 A1 | 9/2001 | Sakaguchi | |
| 2001/0024116 A1 | 9/2001 | Draving | |
| 2001/0030549 A1 | 10/2001 | Gleason et al. | |
| 2001/0043073 A1 | 11/2001 | Montoya | |
| 2001/0044152 A1 | 11/2001 | Burnett | |
| 2001/0045511 A1 | 11/2001 | Moore et al. | |
| 2001/0054906 A1 | 12/2001 | Fujimura | |
| 2002/0005728 A1 | 1/2002 | Babson et al. | |
| 2002/0008533 A1 | 1/2002 | Ito et al. | |
| 2002/0009377 A1 | 1/2002 | Shafer | |
| 2002/0009378 A1 | 1/2002 | Obara | |
| 2002/0011859 A1 | 1/2002 | Smith et al. | |
| 2002/0011863 A1 | 1/2002 | Takahashi et al. | |
| 2002/0050828 A1 | 5/2002 | Seward, IV et al. | |
| 2002/0070743 A1 | 6/2002 | Felici et al. | |
| 2002/0070745 A1 | 6/2002 | Johnson et al. | |
| 2002/0079911 A1 | 6/2002 | Schwindt | |
| 2002/0109088 A1 | 8/2002 | Nara et al. | |
| 2002/0118034 A1 | 8/2002 | Laureanti | |
| 2002/0149377 A1 | 10/2002 | Hefti et al. | |
| 2002/0153909 A1 | 10/2002 | Petersen et al. | |
| 2002/0163769 A1 | 11/2002 | Brown | |
| 2002/0168659 A1 | 11/2002 | Hefti et al. | |
| 2002/0176160 A1 | 11/2002 | Suzuki et al. | |
| 2002/0180466 A1 | 12/2002 | Hiramatsu et al. | |
| 2002/0197709 A1 | 12/2002 | van der Weide et al. | |
| 2003/0010877 A1 | 1/2003 | Landreville et al. | |
| 2003/0030822 A1 | 2/2003 | Finarov | |
| 2003/0032000 A1 | 2/2003 | Liu et al. | |
| 2003/0040004 A1 | 2/2003 | Hefti et al. | |
| 2003/0057513 A1 | 3/2003 | Leedy | |
| 2003/0062915 A1 | 4/2003 | Arnold et al. | |
| 2003/0072549 A1 | 4/2003 | Facer et al. | |
| 2003/0076585 A1 | 4/2003 | Ledley | |
| 2003/0077649 A1 | 4/2003 | Cho et al. | |
| 2003/0088180 A1 | 5/2003 | Van Veen et al. | |
| 2003/0119057 A1 | 6/2003 | Gascoyne et al. | |
| 2003/0139662 A1 | 7/2003 | Seidman | |
| 2003/0139790 A1 | 7/2003 | Ingle et al. | |
| 2003/0155939 A1 | 8/2003 | Lutz et al. | |
| 2003/0170898 A1 | 9/2003 | Gundersen et al. | |

| | | | | | |
|---|---|---|---|---|---|
| 2003/0184332 A1 | 10/2003 | Tomimatsu et al. | DE | 9313420 | 10/1993 |
| 2003/0215966 A1 | 11/2003 | Rolda et al. | DE | 19522774 | 1/1997 |
| 2004/0015060 A1 | 1/2004 | Samsoondar et al. | DE | 19542955 | 5/1997 |
| 2004/0021475 A1 | 2/2004 | Ito et al. | DE | 19618717 | 1/1998 |
| 2004/0061514 A1 | 4/2004 | Schwindt et al. | DE | 19749687 | 5/1998 |
| 2004/0066181 A1 | 4/2004 | Theis | DE | 29809568 | 10/1998 |
| 2004/0069776 A1 | 4/2004 | Fagrell et al. | DE | 10000324 | 7/2001 |
| 2004/0090223 A1 | 5/2004 | Yonezawa | DE | 20220754 | 5/2004 |
| 2004/0095145 A1 | 5/2004 | Boudiaf et al. | EP | 0230766 | 12/1985 |
| 2004/0095641 A1 | 5/2004 | Russum et al. | EP | 0195520 | 9/1986 |
| 2004/0100276 A1 | 5/2004 | Fanton | EP | 0230348 | 7/1987 |
| 2004/0100297 A1 | 5/2004 | Tanioka et al. | EP | 0259163 | 3/1988 |
| 2004/0108847 A1 | 6/2004 | Stoll et al. | EP | 0259183 | 3/1988 |
| 2004/0113640 A1 | 6/2004 | Cooper et al. | EP | 0259942 | 3/1988 |
| 2004/0130787 A1 | 7/2004 | Thome-Forster et al. | EP | 0261986 | 3/1988 |
| 2004/0132222 A1 | 7/2004 | Hembree et al. | EP | 0270422 | 6/1988 |
| 2004/0134899 A1 | 7/2004 | Hiramatsu et al. | EP | 0333521 | 9/1989 |
| 2004/0140819 A1 | 7/2004 | McTigue et al. | EP | 0460911 | 12/1991 |
| 2004/0147034 A1 | 7/2004 | Gore et al. | EP | 0846476 | 6/1998 |
| 2004/0162689 A1 | 8/2004 | Jamneala et al. | EP | 0945736 | 9/1999 |
| 2004/0170312 A1 | 9/2004 | Soenksen | GB | 579665 | 8/1946 |
| 2004/0175294 A1 | 9/2004 | Ellison et al. | GB | 2014315 | 8/1979 |
| 2004/0186382 A1 | 9/2004 | Modell et al. | GB | 2179458 | 3/1987 |
| 2004/0193382 A1 | 9/2004 | Adamian et al. | JP | 52-19046 | 2/1977 |
| 2004/0197771 A1 | 10/2004 | Powers et al. | JP | 53037077 | 4/1978 |
| 2004/0199350 A1 | 10/2004 | Blackham et al. | JP | 53-052354 | 5/1978 |
| 2004/0201388 A1 | 10/2004 | Barr | JP | 55115383 | 9/1980 |
| 2004/0207072 A1 | 10/2004 | Hiramatsu et al. | JP | 56-007439 | 1/1981 |
| 2004/0207424 A1 | 10/2004 | Hollman | JP | 5691503 | 7/1981 |
| 2004/0239338 A1 | 12/2004 | Jonsson et al. | JP | 56088333 | 7/1981 |
| 2004/0246004 A1 | 12/2004 | Heuermann | JP | 57075480 | 5/1982 |
| 2004/0251922 A1 | 12/2004 | Martens et al. | JP | 57163035 | 10/1982 |
| 2005/0024069 A1 | 2/2005 | Hayden et al. | JP | 57171805 | 10/1982 |
| 2005/0026276 A1 | 2/2005 | Chou | JP | 58-130602 | 8/1983 |
| 2005/0030047 A1 | 2/2005 | Adamian | JP | 594189 U | 1/1984 |
| 2005/0054029 A1 | 3/2005 | Tomimatsu et al. | JP | 60-5462 | 4/1984 |
| 2005/0062533 A1 | 3/2005 | Vice | JP | 60-236241 | 11/1985 |
| 2005/0068054 A1 | 3/2005 | Mok et al. | JP | 61142802 | 6/1986 |
| 2005/0083130 A1 | 4/2005 | Grilo | JP | 62-11243 | 1/1987 |
| 2005/0088191 A1 | 4/2005 | Lesher | JP | 62-51235 | 3/1987 |
| 2005/0101846 A1 | 5/2005 | Fine et al. | JP | 62-58650 | 3/1987 |
| 2005/0116730 A1 | 6/2005 | Hsu | JP | 62098634 | 5/1987 |
| 2005/0142033 A1 | 6/2005 | Glezer et al. | JP | 62107937 | 5/1987 |
| 2005/0151548 A1 | 7/2005 | Hayden et al. | JP | 62-179126 | 8/1987 |
| 2005/0156675 A1 | 7/2005 | Rohde et al. | JP | 62239050 | 10/1987 |
| 2005/0164160 A1 | 7/2005 | Gunter et al. | JP | 62295374 | 12/1987 |
| 2005/0165316 A1 | 7/2005 | Lowery et al. | JP | 63-108736 | 5/1988 |
| 2005/0168722 A1 | 8/2005 | Forstner et al. | JP | 63-129640 | 6/1988 |
| 2005/0172703 A1 | 8/2005 | Kley | JP | 63-143814 | 6/1988 |
| 2005/0174191 A1 | 8/2005 | Brunker et al. | JP | 63-152141 | 6/1988 |
| 2005/0178980 A1 | 8/2005 | Skidmore et al. | JP | 63-192246 | 8/1988 |
| 2005/0179444 A1 | 8/2005 | Tiemeijer | JP | 63-318745 | 12/1988 |
| 2005/0195124 A1 | 9/2005 | Puente Baliarda et al. | JP | 64-21309 | 2/1989 |
| 2005/0229053 A1 | 10/2005 | Sunter | JP | 1-165968 | 6/1989 |
| 2005/0236587 A1 | 10/2005 | Kodama et al. | JP | 1-214038 | 8/1989 |
| 2005/0237102 A1 | 10/2005 | Tanaka | JP | 01209380 | 8/1989 |
| 2006/0030060 A1 | 2/2006 | Noguchi et al. | JP | 1-219575 | 9/1989 |
| 2006/0052075 A1 | 3/2006 | Galivanche et al. | JP | 1-296167 | 11/1989 |
| 2006/0155270 A1 | 7/2006 | Hancock et al. | JP | 2-22836 | 1/1990 |
| 2006/0184041 A1 | 8/2006 | Andrews et al. | JP | 2-141681 | 5/1990 |
| 2006/0220663 A1 | 10/2006 | Oikawa | JP | 02124469 | 5/1990 |
| 2006/0226864 A1 | 10/2006 | Kramer | JP | 02135804 | 5/1990 |
| 2007/0024506 A1 | 2/2007 | Hardacker | JP | 2-191352 | 7/1990 |
| 2007/0030021 A1 | 2/2007 | Cowan et al. | JP | 3-175367 | 7/1991 |
| | | | JP | 3196206 | 8/1991 |
| | FOREIGN PATENT DOCUMENTS | | JP | 03228348 | 10/1991 |
| | | | JP | 04130639 | 5/1992 |
| CN | 1083975 | 3/1994 | JP | 04159043 | 6/1992 |
| DE | 2951072 | 7/1981 | JP | 04206930 | 7/1992 |
| DE | 3426565 | 1/1986 | JP | 4-340248 | 11/1992 |
| DE | 3637549 | 5/1988 | JP | 05082631 | 4/1993 |
| DE | 288234 | 3/1991 | JP | 5-113451 | 5/1993 |
| DE | 4223658 | 1/1993 | JP | 5157790 | 6/1993 |

| | | |
|---|---|---|
| JP | 5166893 | 7/1993 |
| JP | 6-71425 | 3/1994 |
| JP | 6-85044 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7005078 | 1/1995 |
| JP | 7012871 | 1/1995 |
| JP | 7-201945 | 8/1995 |
| JP | 8035987 | 2/1996 |
| JP | 8-261898 | 10/1996 |
| JP | 08330401 | 12/1996 |
| JP | 09127432 | 5/1997 |
| JP | 10-48256 | 2/1998 |
| JP | 10116866 | 5/1998 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | W00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17.27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF) Software, " MT950D Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, INC., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using a Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542, Robert D. Grober, Robert J. Schoelkopf, and Daniel E. Prober, "Optical antenna: towards a unity efficiency near-field optical probe," Appl. Phys. Lett. 70(11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

* cited by examiner

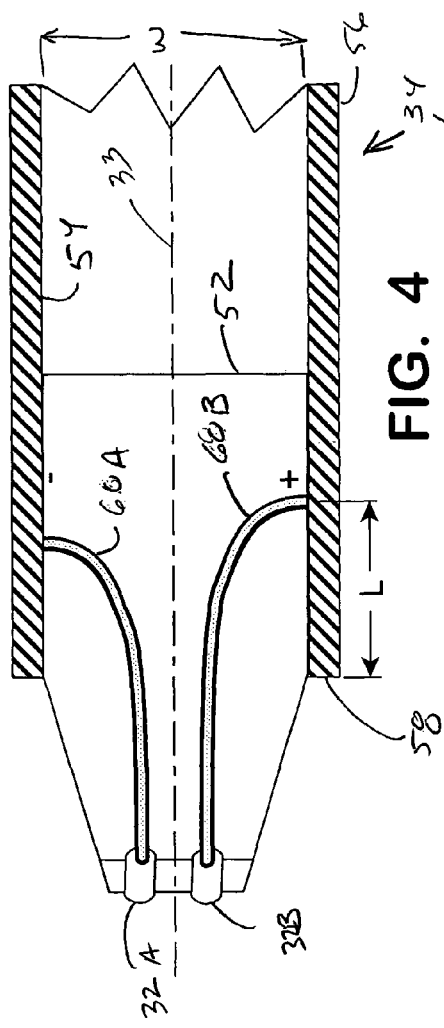
FIG. 4
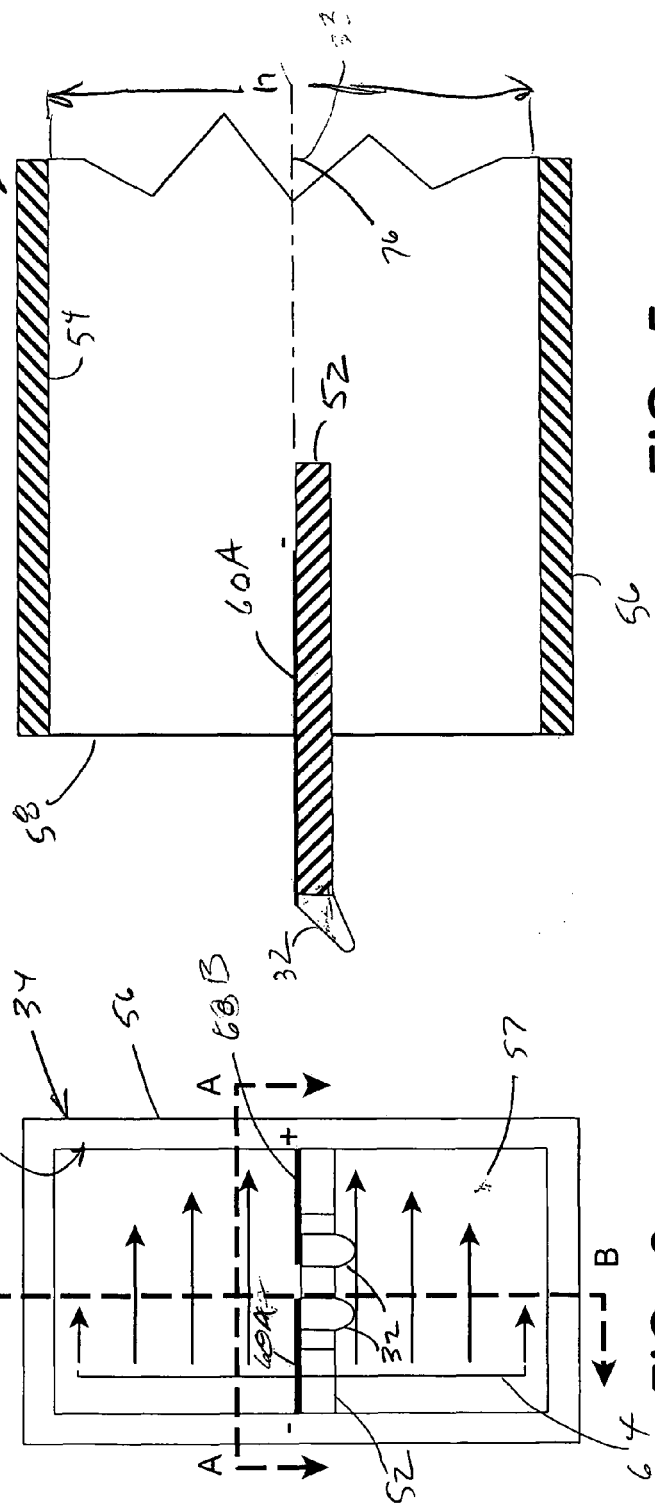
FIG. 5
FIG. 3

DIFFERENTIAL WAVEGUIDE PROBE

CROSS-REFERENCE TO RELATED APPLICATIONS

This application claims the benefit of U.S. Provisional App. No. 60/964,103, filed Aug. 8, 2007.

BACKGROUND OF THE INVENTION

The present invention relates to a wafer probe for high frequency testing of integrated circuits and other electronic devices.

Integrated circuits (ICs) are economically attractive because large numbers of often complex circuits, for example microprocessors, can be inexpensively fabricated on the surface of a wafer or substrate. Following fabrication, individual dies, including one or more circuits, are separated or singulated and encased in a package that provides for electrical connections between the exterior of the package and the circuit on the enclosed die. The separation and packaging of a die comprises a significant portion of the cost of manufacturing a microelectronic device. To monitor and control the IC fabrication process and to avoid the cost of packaging defective dies, manufacturers commonly add electrical circuits or test structures to the wafer to enable on-wafer testing or "probing" to verify characteristics of the integrated circuits before the dies are singulated.

A test structure or device-under-test (DUT) typically comprises a simple circuit that includes a copy of one or more of the basic circuit elements of the integrated circuit, such as a single line of conducting material, a chain of vias or a single transistor. The circuit elements of the DUT are typically produced with the same processes and in the same layers of the fabrication as the corresponding elements of the marketable integrated circuits. Since the circuit elements of the DUT are fabricated with the same processes as the corresponding elements of the integrated circuits, the electrical properties of the DUT are expected to be representative of the electrical properties of the corresponding components of the integrated circuits. In addition to the DUT, test structures typically include a plurality of metallic contact or probe pads that are deposited at the wafer's surface and a plurality of conductive vias that interconnect the probe pads and the subsurface DUT. The performance of the test structure is typically tested by applying a test instrument generated signal to the probe pads and measuring the response of the test structure to the signal.

At higher frequencies, on-wafer characterization is commonly performed with a network analyzer. The network analyzer comprises a source of an AC signal, commonly a radio frequency (RF) or microwave frequency signal, that is transmitted to the DUT to produce a response. A forward-reverse switch directs the stimulating signals toward one or more of the probe pads of the DUT where a portion of the signal is transmitted to the DUT and another portion is reflected. Directional couplers or bridges pick off the forward or reverse waves traveling to and from the DUT. The waves are down-converted by intermediate frequency (IF) sections of the network analyzer where the signals are filtered, amplified and digitized for further processing and display. The result is a plurality of s-parameters (scattering parameters), the ratio of a normalized power wave comprising the response of the DUT to the normalized power wave comprising the stimulus supplied by the signal source.

The preferred interconnection between a network analyzer or other test instrument and a DUT is a wafer probe typically comprising a movable body that supports one or more contacts or probe tips that are arranged to engage a test structure's probe pad(s) on the surface of a wafer. Burr et al., U.S. Pat. No. 5,565,788, disclose a microwave probe comprising a support block which is attachable to a movable probe supporting member of a probe station. The support block supports a first end portion of a section of coaxial cable. The second end of the coaxial cable is freely suspended and, in turn, supports a probe tip section. Integrated circuits commonly utilize single ended or ground referenced signaling with a ground plane at the lower surface of the substrate on which the active and passive devices of the circuit are fabricated. Although there are a number of potential arrangements for the probe pads of a test structure that utilizes single-ended signaling, a common arrangement places a signal probe pad between a pair of spaced apart, grounded probe pads, a so-called ground-signal-ground (GSG) arrangement. The tip section of the microwave probe disclosed by Burr et al. includes a central signal conductor and one or more ground conductors generally arranged parallel to each other in a common plane to form a controlled impedance structure. The signal conductor is electrically connected to the inner conductor of a coaxial cable and the ground conductors are electrically connected to the outer conductor of the cable at the freely suspended end of the cable. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and, despite the presence of the shielding member, the end portions are able to resiliently flex relative to each other and away from their common plane so as to permit probing of devices having non-planar probe pad surfaces.

In another embodiment, Burr et al. disclose a microwave probe that includes a supporting section of coaxial cable including an inner conductor coaxially surrounded by an outer conductor. A tip section of the microwave probe includes a signal line extending along the top side of a dielectric substrate connecting a probe finger with the inner conductor of the coaxial cable. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor of the coaxial cable. The signal conductor and the ground conductor fingers (connected to the shield by vias) each have an end portion extending beyond the shield member and, despite the presence of the shielding member, the end portions are able to resiliently flex relative to each other and away from their common plane so as to permit devices having non-planar contact surfaces to be probed. While the structures disclosed by Burr et al. are intended to provide uniform results over a wide frequency range, they unfortunately tend to have non-uniform response characteristics at higher microwave frequencies.

Gleason et al., U.S. Pat. No. 6,815,963 B2, disclose a probe comprising a dielectric substrate that is attached to a shelf cut in the underside of the probe tip supporting portion of coaxial cable. The substrate projects beyond the end of the cable in the direction of the longitudinal axis of the cable. A signal trace is formed on the upper side of the substrate and conductively connects the center conductor of the coaxial cable with a via at the distal end of the signal trace, near the distal edge of the substrate. The via, passes through the substrate and conductively connects the signal trace to a contact bump or tip that will be brought into contact with a probe pad of the test structure to enable communication of a single-ended signal from the center conductor of the coaxial cable to the DUT. A conductive shield which is preferably planar in nature is affixed to the bottom surface of the substrate and electrically connected to the outer conductor of the coaxial cable. The conductive shield is typically coextensive with the lower surface of the substrate with the exception of an aperture encircling the contact tip for the signal trace. Contacts for contacting probe pads connected to the ground plane and spaced to either side of the signal probe pad of the test structure may also be provided. The conductive traces comprise a coplanar waveguide when the probe is operated at microwave frequencies.

At frequencies between DC and approximately 60 gigahertz (GHz), a coaxial cable is frequently preferred for communicating signals between the test instrumentation and the DUT. However, the central signal conductor of a coaxial cable is relatively small and, at microwave frequencies, skin effect restricts the current carrying area of the conductor to a thin layer at the conductor's surface. Heating of the dielectric separating the signal conductor and the coaxial ground conductor, may further impede the transmission of the signal. At frequencies greater than 40 GHz the probe and the test instrument are commonly interconnected with a waveguide. The waveguide comprises a hollow tube of conductive material, often rectangular in shape. Electromagnetic waves propagate in the waveguide channel by successive reflections from the inside surface(s) of the wall defining the waveguide channel. A waveguide is characterized by excellent isolation between signals and very low loss.

While a waveguide provides a low loss path for communicating signals between a probe and the related test instrumentation, the probes of Burr et al. and Gleason et al. rely on coaxial cable for connecting the waveguide and the probe tip. In addition to the reduced transmission efficiency of the coaxial cable resulting from skin effect and dielectric heating, the transition from coaxial cable to waveguide can be difficult and can introduce a substantial loss of signal. The transition from the waveguide to the coaxial cable is commonly accomplished by inserting the tip of the coaxial cable's center conductor into the interior of the waveguide and connecting the outer conductor to the wall of the waveguide. The projecting conductor acts as an antenna for the signals propagating in the waveguide. In a typical implementation a backshort, usually made of brass or some other reflective material and having a reflective face, is also included in the waveguide channel. The backshort is preferably located close to the projecting center conductor and typically oriented perpendicular to the waveguide channel so as to reflect any alternating signal present within the waveguide channel towards the projecting conductor. If properly positioned, the backshort will reflect the alternating signal within the waveguide into a standing wave pattern and signal degradation will be minimized in the transition from the coaxial cable to the waveguide. However, adjusting the position of the backshort relative to the center conductor of the coaxial cable to optimize performance in the primary band of the alternating signals, is often difficult and at high frequencies, very small deviations from the optimal position of the backshort may lead to significant signal degradation.

Katoh, U.S. Pat. No. 5,408,188, describes a wafer probe for high frequency single-ended signals in which a waveguide transitions directly to a coplanar line at the probe tip. The probe tip comprises a dielectric blade having a centrally located (laterally) signal conductor affixed to the lower surface of the blade. Ground conductors, spaced apart on either side of the signal conductor, are also affixed to the lower surface of the blade. The blade is clamped between separable upper and lower portions of the waveguide with the ground conductors in contact with the lower interior surface of the waveguide's wall. A stepped ridge affixed to the upper interior surface of the wall extends downward in the waveguide to approximately the level of the lower surface of the dielectric blade and the signal conductor which is affixed to the lower surface of the dielectric blade. The signal conductor is conductively interconnected with the downward projecting ridge. The high frequency waveguide probe enables probing with high frequency, single ended signals through the commonly utilized ground-signal-ground probe pad arrangement. However, the probe requires a special, split, waveguide section that includes a downwardly projecting ridge in the interior of the waveguide and, according to Katoh, the transition from the coplanar line of the probe tip to the waveguide can result in significant transmission losses.

While single-ended or ground referenced signaling predominates at lower frequencies, the integrity of single-ended signals is jeopardized at higher frequencies. Integrated circuits are fabricated by successive deposition of conductive, semi-conductive and insulating materials on a semi-conducting wafer and, as a result, electrical interconnections commonly exist between parts of the circuit's devices and between the devices and the substrate on which they are fabricated. These interconnections are commonly capacitive or inductive in nature resulting in frequency dependent parasitic impedances that make the true nature of ground referenced signals uncertain as the operating frequency of the circuit increases.

Referring to FIG. 9, a balanced device 100 comprises two nominally identical circuit halves 100A, 100B that are "virtually" grounded 104 at the symmetrical axis 102 of the two circuit halves. A balanced device outputs a differential mode signal comprising even and odd mode components of equal amplitude and opposite phase ($S_o^{+1}$ and $S_o^{-1}$) 106A, 106B when stimulated with a differential mode signal comprising even and odd mode components of equal amplitude and opposite phase ($S_i^{+1}$ and $S_i^{-1}$) 108A, 108B. The virtual ground is independent of the physical ground path of the IC and, at the operating frequency, the potential at the virtual ground does not change with time regardless of the amplitude of the stimulating signal. Balanced devices have become increasingly attractive as the operating frequencies of ICs have increased because the virtual ground enables balanced or differential circuits to tolerate poor RF grounding better than circuits operated with single-ended signals.

What is desired, therefore, is a low cost wafer probe enabling efficient communication of high frequency, differential signals between a DUT and a test instrument.

BRIEF DESCRIPTION OF THE DRAWINGS

FIG. 3 is an end view of a waveguide for a waveguide probe.

FIG. 4 is a partial section view of the waveguide of FIG. 3 along line A-A.

FIG. 5 is a partial section view of the waveguide of FIG. 3 along line B-B.

DETAILED DESCRIPTION OF PREFERRED EMBODIMENTS

Figure 1:
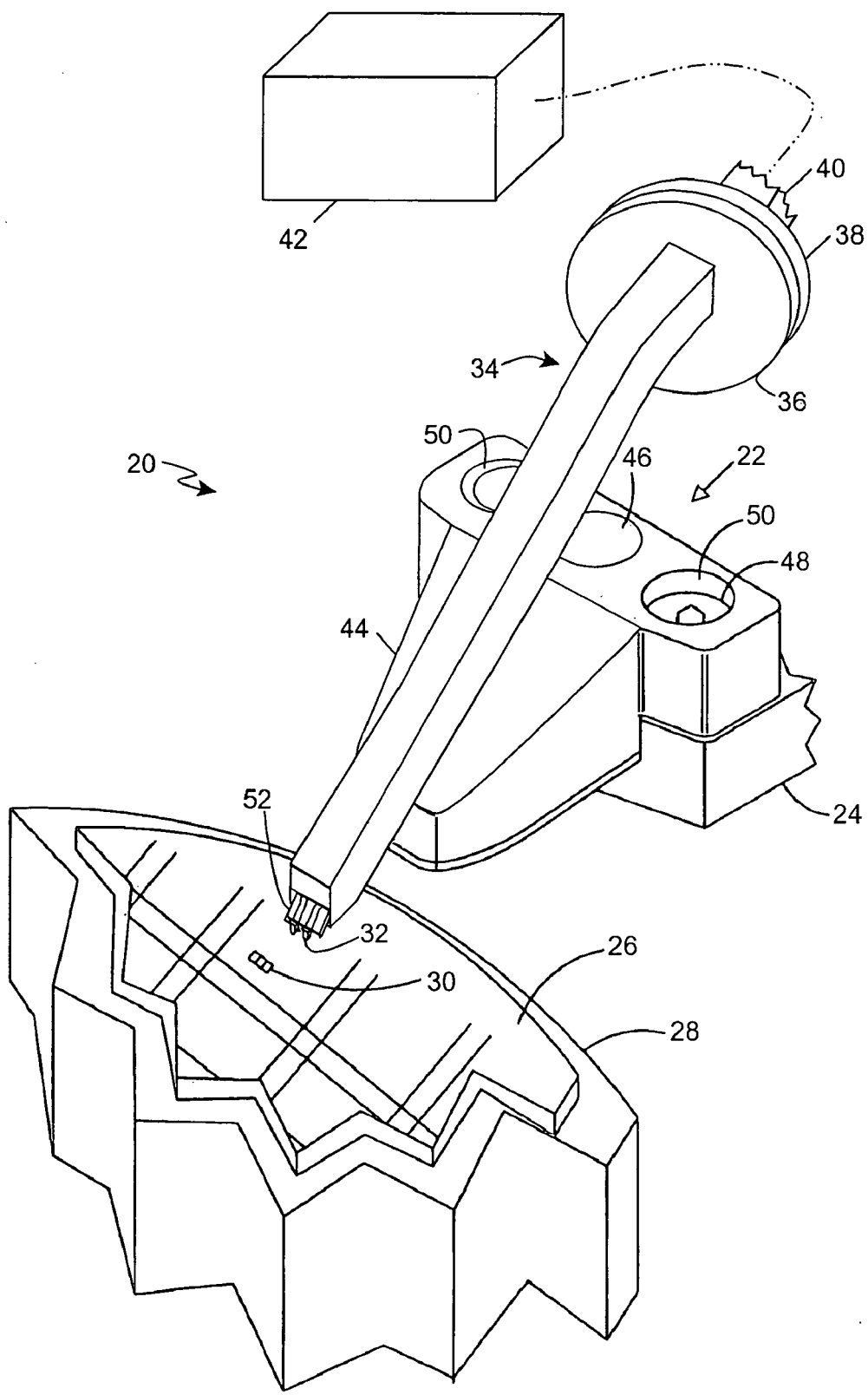
FIG. 1 is a partial prospective view of a probe chuck and a waveguide probe.

Integrated circuits (ICs) and other microelectronic devices are fabricated by successively depositing and etching layers of conductive, semi-conductive or insulating material on the surface of a wafer or substrate of semi-conducting material. Typically, the rear surface of the wafer, the back plane, is connected to a ground potential and signals are input to and output by the circuit through conductors that are deposited proximate the front surface of the wafer.

ICs are commonly inspected "on wafer" by measuring the response of one or more test structures when the structures are stimulated by a test signal. A test structure typically comprises a simple circuit or device under test (DUT) comprising one or more of the elements of the marketable integrated circuits. The devices of the DUT are typically fabricated with the same processes and in the same layers of the wafer fabrication as the corresponding element(s) of the integrated circuit. In addition, a test structure typically comprises a plurality of probe pads that are deposited on the surface of the wafer and conductively connected by a plurality of vias to the DUT which located below the surface.

Preferably, the test structure or other device under test is temporarily connected to test instrumentation by a probe assembly. The probe assembly typically comprises a probe body that is secured to a movable portion of a probe station which includes a mechanism for securing a wafer and moving the probe assembly in −x, −y, and −z directions to enable contacts on the probe to be brought into conductive engagement with the probe pads on the surface of the wafer. At frequencies in the radio and microwave frequency ranges, a network analyzer is commonly used to generate the test signal and measure the response of the DUT.

The test instrumentation is frequently connected to the probe by a length of coaxial cable which is connected to a coaxial cable connector or adapter which is affixed to the probe's body. A second portion of coaxial cable typically has one end that is supported by the probe's body and a second end that is freely suspended. The conductors at the end supported by the body of the probe are interconnected with the adapter enabling signals to be communicated from the test instrumentation to the freely suspended end of the second length of coaxial cable. A microstrip-type probe tip is commonly attached to the freely suspended end of the second portion of coaxial cable. A microstrip-type probe tip typically comprises a plurality of contacts or probe tips that are affixed to a substrate that is, in turn, affixed to the freely suspended end of the coaxial cable. Typically, one contact conducts the signal from the central conductor to a probe pad of the test structure. In addition, one or more contacts connected to the outer conductor of the coaxial cable are arranged to contact probe pads that are interconnected with the ground plane at the back surface of the wafer enabling the amplitude of the single-ended signals to be referenced to the ground potential of the DUT.

At higher microwave frequencies, the transmission efficiency of coaxial cable is substantially reduced as a result of skin effect and heating of the dielectric separating the coaxial conductors. In addition, coaxial cable adapters that can efficiently conduct signals at frequencies above 65 GHz have only recently become available and are quite expensive. Accordingly, for frequencies greater than approximately 40 GHz, it is common to utilize a waveguide to interconnect the instrumentation with the portion of the coaxial cable that supports the probe tip. A waveguide is characterized by excellent isolation between signals and very low signal loss. However, the transition from a coaxial cable to a waveguide can be expensive and difficult to execute and often results in a substantial signal loss in addition to the signal loss in the portion of coaxial cable that supports the probe tip. The present inventor considered the frequency limitations and the cost of coaxial cable components suitable for high frequencies and concluded that the transmission efficiency of a high frequency probe could be improved and the cost reduced with a waveguide probe that eliminates coaxial cable from the signal path connecting the probe's contacts to the test instrumentation.

Figure 9:
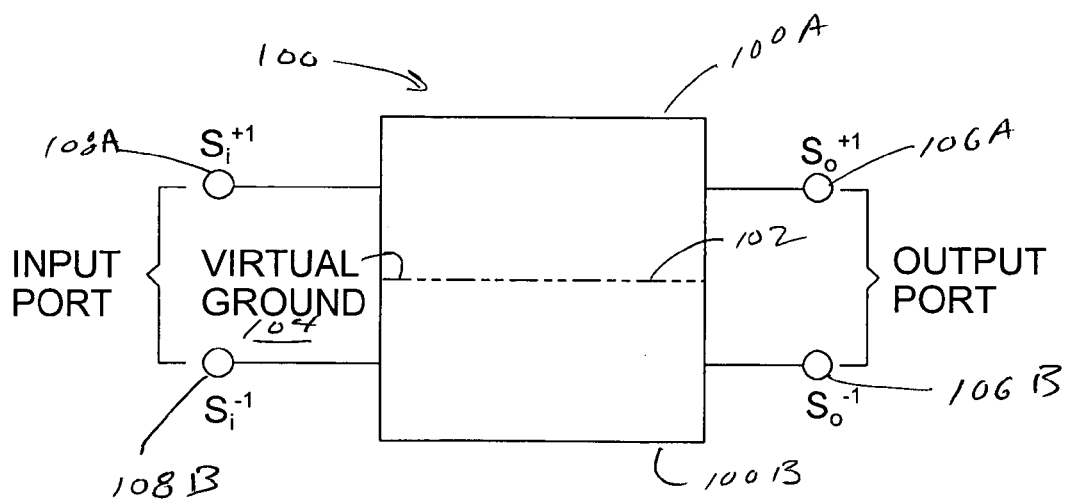
FIG. 9 is a block diagram of a balanced device.

Further, the inventor recognized that devices utilizing single ended or ground referenced signals were susceptible to poor grounding at microwave frequencies. As a result of the layering of conductive, semi-conductive and insulating materials, parasitic electrical interconnections commonly exist between parts of the devices that comprise an integrated circuit and between the devices and the substrate on which they are fabricated. These interconnections are typically capacitive and inductive in nature and the parasitic impedances between respective portions of the circuit and the ground plane are frequency dependent making the amplitude of a ground referenced signal uncertain. Referring to FIG. 9, a balanced device 100 comprises two nominally identical circuit halves 100A, 100B that are "virtually" grounded 104 at the symmetrical axis 102 of the circuit halves. A balanced device outputs a differential mode signal comprising even and odd mode components of equal amplitude and opposite phase ($S_o^{+1}$ and $S_o^{-1}$) 106A, 106B when stimulated with a differential mode signal comprising even and odd mode components of equal amplitude and opposite phase ($S_i^{+1}$ and $S_i^{-1}$) 108A, 108B. The virtual ground is independent of the physical ground path of the circuit and, at the operating frequency, the potential at the virtual ground does not change with time regardless of the amplitude of the stimulating signal. The virtual ground enables balanced or differential circuits to tolerate poor RF grounding better than circuits operated with single ended signals. The inventor concluded that a wafer could be probed with differential signals at microwave frequencies with a waveguide probe that incorporates neither high cost coaxial cable components nor special waveguide components.

Figure 2:
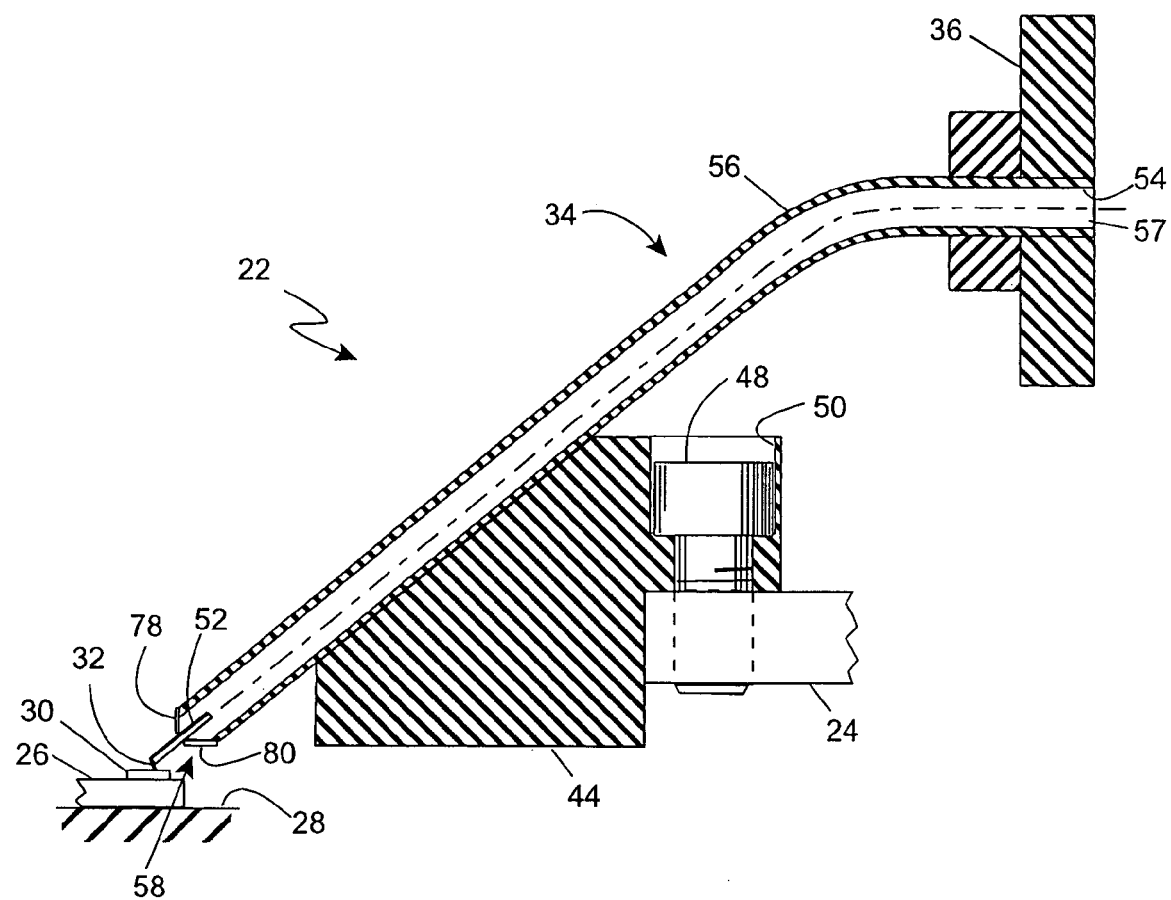
FIG. 2 is a section view of a waveguide probe.

Referring in detail to the drawings where similar parts are identified by like reference numerals, and, more particularly to FIGS. 1 and 2, a probing apparatus 20 includes a waveguide probe 22. The probe is designed to be mounted on a probe-supporting member 24 of a probe station so as to be movable to a suitable position for probing a DUT, such as an individual component or a test structure on a wafer 26. In this type of application, the wafer is typically restrained on the upper surface of a chuck 28 which is part of the same probe station. The upper surface of the chuck commonly includes a plurality of apertures (not shown) that are selectively connectible to a source of vacuum. A wafer is placed on the upper surface of the chuck and air pressure secures the wafer to the chuck's surface when the vacuum source is connected to the apertures.

The exemplary waveguide probe 22 has a port which comprises a waveguide 34 having a flanged connector 36. The flanged connector enables selective connection, through a mating flanged connector 38, to an external waveguide 40 that connects the probe to the test instrumentation 42. The flanged connector may comprise, for example, one or more flexible or rotary connectors enabling movement of the probe relative to the external waveguide and the instrumentation. The waveguide 34 is affixed to a primary support block 44 of the probe which, in the preferred embodiment shown, is suitably constructed for connection to the probe-supporting member 24. To effect connection to the probe-supporting member, a round opening 46 that is formed on the support block is snugly and slidably fitted onto an alignment pin (not shown) that projects upward from the probe-supporting member. Screws 48, inserted into each of a pair of countersunk openings 50 in the block, engage a corresponding threaded aperture in the probe-supporting member to secure the probe to the supporting member. Ordinarily an −x, −y, −z positioning mechanism, such as a micrometer knob assembly, is provided to effect movement of the supporting member relative to the chuck so that the contacts 32 of the probe can be brought into pressing engagement with the probing pads 30 of a test structure or other DUT.

Referring also to FIGS. 3, 4, and 5, a first end portion of a dielectric substrate or membrane 52 is affixed to the interior surface 54 of the wall 56 that defines the waveguide channel 57 of the waveguide 34. A second portion of the membrane projects beyond the end 58 of the waveguide's wall. One or more conductive signal traces 60A, 60B are supported on a surface of the membrane. The conductive traces 60 may be, for example, deposited on the surface of the membrane using any technique or may be otherwise affixed to or supported on the surface of the membrane. The thickness, length and configuration of the traces may be varied to optimize the performance of the probe for a particular band of frequencies to be transmitted by the probe. One end of each conductive trace 60 is conductively connected with the interior surface of the wall of the waveguide and electrically interconnects the wall of the waveguide with a respective contact 32A, 32B. The contact may include a conductive portion, such as a via portion, that passes through the substrate enabling conduction of the signals from one side of the membrane to the other. The projecting end of the membrane and portions of the contacts may formed at an angle to the upper surface of the membrane to improve the visibility of the contacts when the waveguide is arranged at an angle to surface of the chuck.

While a wide variety of cross-sections are available for waveguides, the cross-section of the waveguide channel preferably has a longer major axis or dimension (h) and a shorter minor axis or dimension (w) normal to the longitudinal axis 33 of the waveguide channel. For example, a rectangular waveguide channel is defined by a major dimension parallel to the longer sides of the rectangular channel and a minor dimension parallel to the shorter sides of the channel. Electromagnetic waves propagate in a waveguide channel by successive reflections from the inside surface(s) of the wall. A waveguide channel with unequal major and minor dimensions prevents mode rotation of the microwave signals.

The electric field is the gradient of the potential difference between points on the interior surface of the wall on opposite sides of the waveguide channel. In a waveguide channel defined by a longer major dimension and a shorter minor dimension, the potential difference is maximized at opposite sides of the waveguide channel at the midpoint or bisector of the major dimension. For example, in a rectangular waveguide, the distribution of the electric field 66 (illustrated schematically with a bracket) is maximized at the midpoint of the longest side of the rectangular waveguide channel. The field distribution and the potential difference in the waveguide channel permits a simple conductive connection for differential signals between the second ends of the conductive signal traces 60A, 60B and the interior surface of the waveguide's wall on opposite sides of the waveguide channel at the respective intersections of the bisector of the waveguide channel's major dimension. For example, the interconnections between the signal traces 60A, 60B and the wall of the waveguide is preferably at the midpoint of the longer walls of a rectangular waveguide channel. While interconnection of the traces and the wall of the waveguide at the bisection of the major axis of the channel maximizes the potential between the connections, the connections may be shifted away from the respective intersections with the wall by the bisector of the major dimension, by tilting the substrate relative to the wall or otherwise, for the purpose of matching the impedance of the probe with the DUT.

Figure 6:
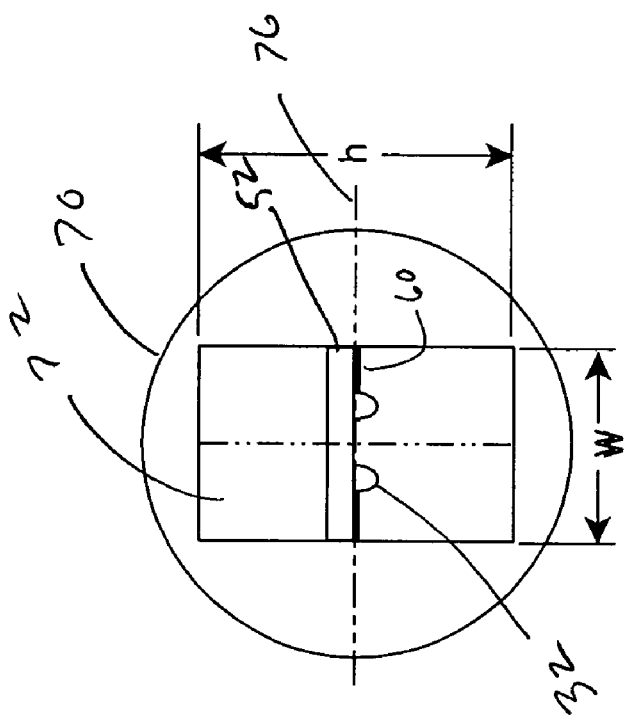
FIG. 6 is an end view of a waveguide for a waveguide probe having a rectangular waveguide channel and a circular external surface.

Referring to also FIG. 6, the dimensions of a waveguide suitable for the high frequency microwaves are relatively small and the availability of waveguides of suitable dimensions may be limited. A suitable waveguide 70 having a rectangular waveguide channel and a circular exterior surface may be fabricated by drilling and broaching or otherwise cutting a rectangular waveguide channel 72 in a solid rod or thick walled tube.

Figure 7:
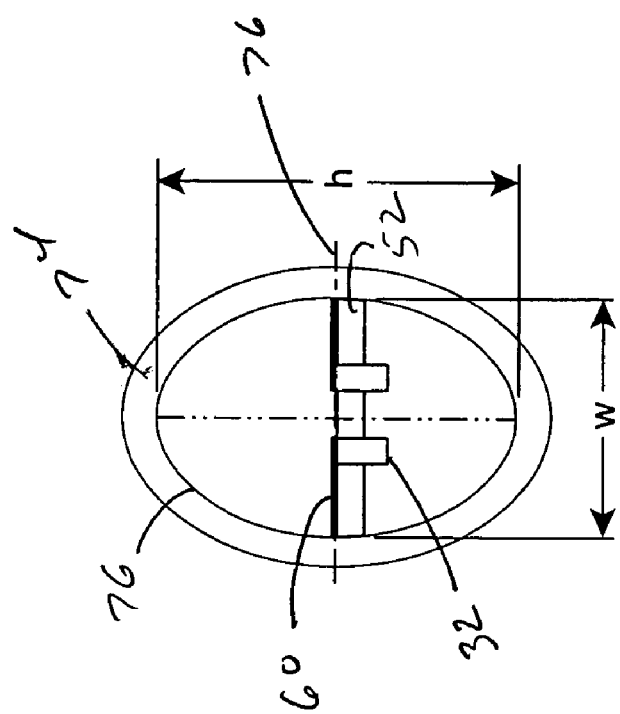
FIG. 7 is an end view of a waveguide for a waveguide probe having an elliptical waveguide channel.

Referring also to FIG. 7, a suitable waveguide 74 having an elliptical channel 79 with a major dimension (h) and a minor dimension (w) may be fabricated by deforming the wall of a circular tube at opposites sides of the tube. Connecting the respective conductive signal traces 60A and 60B to the inside surface of waveguide's wall on opposite sides of the waveguide channel at approximately the bisection of the major axis (h), for example, the bisection of the longer wall of a rectangular waveguide channel, enables a simple, low loss connection for the equal amplitude, out-of-phase, differential signals that are input to or output by a differential signaling DUT.

In addition, preferably, the transition from the coplanar lines of the probe tip to the wall of the waveguide is optimized by conductively interconnecting the conductive signal traces to the wall of the waveguide at a distance (L) from the end 58 of the waveguide 34. The optimum distance (L) is typically less than one-half the wavelength of the center frequency of signals that will be transmitted in the waveguide.

Figure 8:
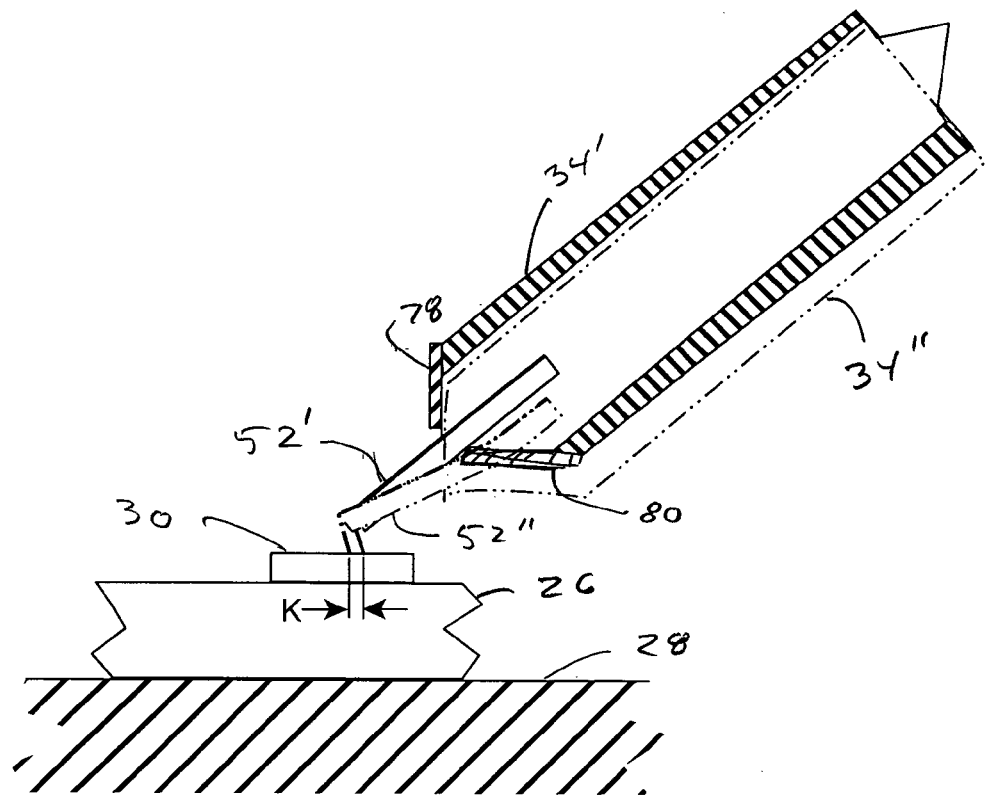
FIG. 8 is a sectional view of an end portion of a waveguide illustrating an effect of vertical displacement of a waveguide probe.

The end portion of the membrane 50 that is within the waveguide channel is secured to the interior surface of the waveguide adjacent the bisection 76 of the major dimension of the waveguide channel enabling the conductive signal traces supported on the surface of the membrane to be interconnected with the waveguide's wall at the bisection of the major dimension. Supporting the conductive signal traces on the upper surface of the membrane reinforces the probe tip's structure but, as illustrated in FIG. 6, the signal traces can be supported on the lower surface of the membrane. The membrane or substrate 52 may be rigid or flexible. A flexible membrane provides resilient support for the contacts enabling both contracts to engage probe pads even if the surfaces of the probe pads are not coplanar. Further, referring to FIG. 8, a flexible membrane produces horizontal movement or scrubbing (K) by the contacts when the probe is displaced vertically after engagement of the contacts and probe pads. Scrubbing improves electrical conduction between the contact and the probe pad by promoting penetration of an insulating oxide layer that can form on the surface of the probe pads.

The waveguide probe can be simplified by leaving the end of the waveguide channel open. However, an open end of the waveguide channel permits an electric and magnetic field distribution that couples to a propagating wave in space and evanescent fields that couple to physical objects proximate the end of the waveguide. Shorting plates 78, 80 blocking portions of the waveguide channel at the end proximate the probe tip can reduce the fields proximate the end of the waveguide. The shorting plates can be arranged at an oblique angle to the longitudinal axis of the waveguide. Preferably, a first shorting plate 78, occluding a first portion of the waveguide channel above the membrane, is arranged to be perpendicular to the surface of the wafer when the probe pads are contacted to improve visibility of the contacts. A second shorting plate 80 below the membrane 52 is preferably arranged substantially parallel to the surface of the wafer when the probe pads are contacted to minimize the length of the membrane that must project from the end of the waveguide and reduce the likelihood that the waveguide will come in contact with wafer. The performance of the wafer probe can be optimized for a particular frequency band by adjusting the angles of the respective shorting plates relative to the longitudinal axis of the waveguide channel.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. An apparatus for probing a device under test; said apparatus comprising:
    (a) an elongate waveguide comprising a waveguide wall including a waveguide end portion and a surface defining a waveguide channel, said waveguide channel defined by a major dimension and a shorter minor dimension, said major dimension and said minor dimension measured substantially normal to a longitudinal axis of said waveguide channel;
    (b) a dielectric substrate comprising a first substrate portion affixed to said waveguide wall adjacent a bisector of said major dimension of said waveguide channel and extending from a point of attachment to said waveguide wall toward an opposing side of said waveguide channel and a second substrate portion supported by said first substrate portion and extending from said waveguide channel a distance beyond said waveguide end portion;
    (c) a contact supported by said substrate and engageable with a probe pad of a device under test; and
    (d) an electrical conductor conductively interconnected with said contact and including a conductor end portion supported by a surface of said substrate, said conductor end portion conductively interconnected with said waveguide wall proximate said bisector of said major dimension of said waveguide channel.

2. The apparatus for probing a device under test of claim 1 wherein said conductor end portion is interconnected with said waveguide wall at a distance from said waveguide end portion that is no greater than one-half of a wave length of a signal to be transmitted in said waveguide.

3. The apparatus for probing a device under test of claim 1 wherein said waveguide channel is substantially rectangular in cross-section.

4. The apparatus for probing a device under test of claim 3 wherein said waveguide wall further includes substantially circular exterior surface.

5. The apparatus for probing a device under test of claim 1 wherein said a waveguide channel has a substantially elliptical cross-section.

6. The apparatus for probing a device under test of claim 1 further comprising a shorting plate occluding a portion of said waveguide channel at said waveguide end portion.

7. The apparatus for probing a device under test of claim 6 wherein said shorting plate includes a substantially planar surface that intersects said longitudinal axis of said waveguide channel at an oblique angle.

8. The apparatus for probing a device under test of claim 7 further comprising a second shorting plate including a substantially planar surface that intersects said longitudinal axis of said waveguide channel at a second oblique angle.

9. The apparatus for probing a device under test of claim 1 wherein said substrate is flexible.

10. The apparatus for probing a device under test of claim 1 further comprising:
    (a) a second contact supported by said substrate and engageable with a second probe pad of said device under test; and
    (b) a second conductor conductively interconnected with said second contact and including a second conductor end portion supported by a surface of said substrate, said second conductor end portion conductively interconnected with said waveguide wall proximate said bisector of said major dimension of said waveguide channel.

11. The apparatus for probing a device under test of claim 10 wherein at least one said first contact and said second contact is conductively interconnected with said waveguide wall at a distance from said waveguide end portion no greater than one-half of a wave length of a signal to be transmitted in said waveguide.

12. An apparatus for probing a device under test; said apparatus comprising:
    (a) an elongate waveguide comprising a waveguide wall including a waveguide end portion and a surface defining a waveguide channel, said waveguide channel defined by a major dimension and a shorter minor dimension, said major dimension and said minor dimension measured substantially normal to a longitudinal axis of said waveguide channel;
    (b) a dielectric substrate comprising a first substrate portion affixed to said waveguide wall adjacent a bisector of said major dimension of said waveguide channel and extending from a point of attachment to said waveguide wall to a second point of attachment on an opposing side of said waveguide channel and a second substrate portion extending from said first substrate portion beyond said waveguide end portion;
    (c) a first electrical contact supported by said substrate and arranged for engagement with a first probe pad of a device under test;
    (d) a first conductor conductively interconnected with said first contact and including a first conductor end portion supported by a surface of said substrate, said first conductor end portion conductively interconnected with said waveguide wall proximate said bisector of said major dimension of said waveguide channel;

(e) a second electrical contact supported by said substrate and arranged for engagement with a second probe pad of said device under test; and (f) a second conductor conductively interconnected with said second contact and including a second conductor end portion supported by a surface of said substrate, said second conductor end portion conductively interconnected with a surface of said waveguide channel at a location opposing said interconnection of said first conductor with said waveguide wall and proximate said bisector of said major dimension of said waveguide channel.

13. The apparatus for probing a device under test of claim 12 wherein said conductor end portion is interconnected with said waveguide wall at a distance from said waveguide end portion that is no greater than one-half of a wave length of a signal to be transmitted in said waveguide.

14. The apparatus for probing a device under test of claim 12 wherein said waveguide channel is substantially rectangular in cross-section.

15. The apparatus for probing a device under test of claim 14 wherein said waveguide wall further includes substantially circular exterior surface.

16. The apparatus for probing a device under test of claim 12 wherein said a waveguide channel has a substantially elliptical cross-section.

17. The apparatus for probing a device under test of claim 12 further comprising a shorting plate occluding a portion of said waveguide channel at said waveguide end portion.

18. The apparatus for probing a device under test of claim 17 wherein said shorting plate includes a substantially planar surface that intersects said longitudinal axis of said waveguide channel at an oblique angle.

19. The apparatus for probing a device under test of claim 18 further comprising a second shorting plate including a substantially planar surface that intersects said longitudinal axis of said waveguide channel at a second oblique angle.

20. The apparatus for probing a device under test of claim 12 wherein said substrate is flexible.

* * * * *